(12) United States Patent
Nangle

(10) Patent No.: US 7,106,622 B2
(45) Date of Patent: Sep. 12, 2006

(54) PHASE-CHANGE MEMORY DEVICE CAPABLE OF PREPROGRAMMING MEMORY CELLS OPTICALLY AND READING/WRITING MEMORY CELLS ELECTRICALLY

(75) Inventor: Peter Nangle, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 533 days.

(21) Appl. No.: 10/043,993

(22) Filed: Jan. 9, 2002

(65) Prior Publication Data
US 2003/0128568 A1    Jul. 10, 2003

(51) Int. Cl.
*G11C 11/00* (2006.01)
*G11B 3/70* (2006.01)

(52) U.S. Cl. .................. 365/163; 365/113; 365/148; 365/215

(58) Field of Classification Search ............... 365/113, 365/122, 148, 163, 215
See application file for complete search history.

(56) References Cited

U.S. PATENT DOCUMENTS

| | | | | |
|---|---|---|---|---|
| 5,051,950 A | * | 9/1991 | Evans et al. | 365/109 |
| 6,317,392 B1 | * | 11/2001 | Lee et al. | 369/30.23 |
| 2005/0259498 A1 | * | 11/2005 | Nangle | 365/226 |

* cited by examiner

*Primary Examiner*—Andrew Q. Tran
(74) *Attorney, Agent, or Firm*—Fish & Richardson P.C.

(57) ABSTRACT

In an embodiment, a phase change non-volatile memory includes a number of memory cells. The memory cells include a phase change material which may transition between two memory states. The phase change material has different electrical properties in different states. The memory cells may be electrically addressable and include a transistor in each cell to electrically read and write data to the cell. An energy beam may be used to pre-program the device by heating selected memory cells, and consequently changing the state of the phase change material.

7 Claims, 3 Drawing Sheets

US 7,106,622 B2

PHASE-CHANGE MEMORY DEVICE CAPABLE OF PREPROGRAMMING MEMORY CELLS OPTICALLY AND READING/WRITING MEMORY CELLS ELECTRICALLY

BACKGROUND

Certain non-volatile memory devices utilize phase change technology to read and write data. The storage mechanism is typically a reversible change of state of a material or structure. For example, CD-Rewritable (CD-RW) and DVD-RAM optical disk drives use laser-induced structural phase change in an alloy layer on the disk to read and write data. The disk drives use laser energy to heat the material between amorphous and crystalline states to write data, and use the difference in reflectivity between the two states to optically read data.

Another class of phase change non-volatile memory devices utilize the electrical properties of the phase change material to read and write data, taking advantage of the difference in resistivity in the material in the different states. In the amorphous state, a small amount of current will pass, and in the crystalline state, the resistance of the material in that state will limit the current. Such devices may use an electric current to heat the material between amorphous and crystalline states.

DETAILED DESCRIPTION

Figure 1:
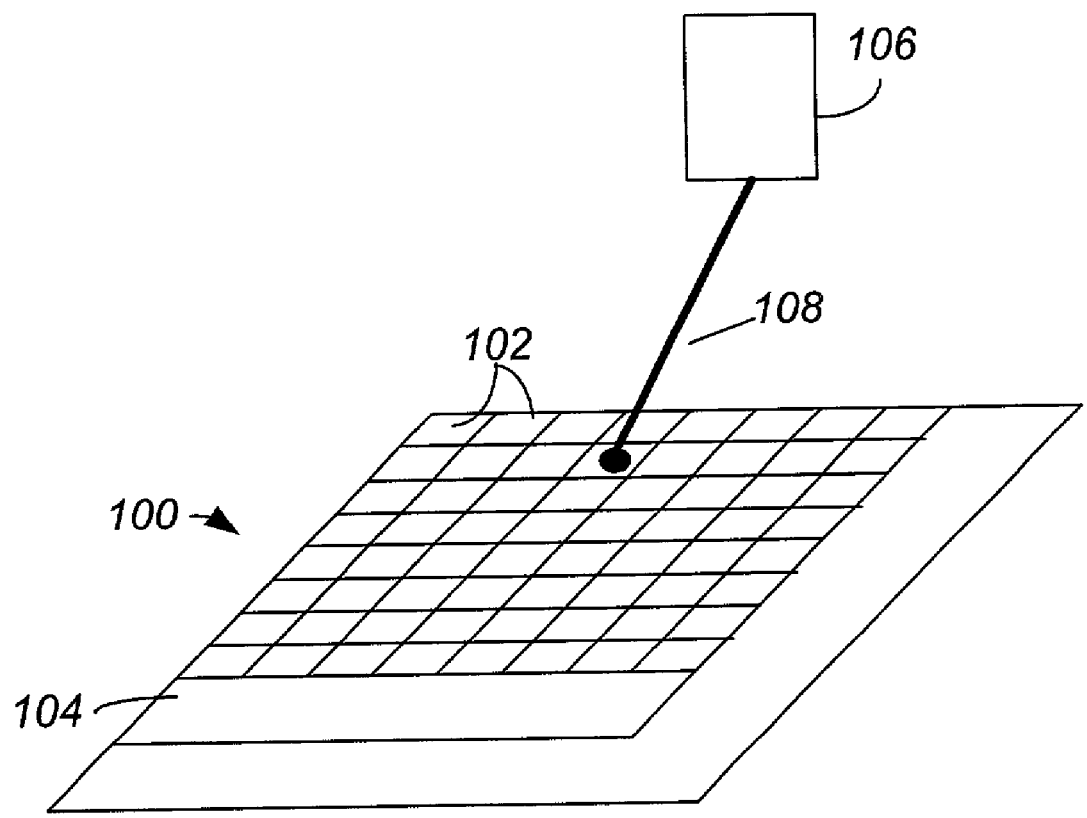
FIG. 1 is a perspective view of a memory device according to an embodiment.

An optically preprogrammable electrically-addressable memory device 100 according to an embodiment is shown in FIG. 1. The memory device may be a non-volatile memory, which includes an array of individually addressable memory cells 102 arranged in rows and columns. Each memory cell includes a phase change material that has different electrical properties in different states, e.g., amorphous and crystalline states. The electrical properties may include resistivity. Individual cells may represent different bits of stored information. Such an electrically addressable non-volatile phase change memory device may be used as direct replacements for other types of non-volatile memories such as Flash memories and volatile memories such as DRAMs.

In normal operation, a circuit 104 may be used to write, erase, and read information stored in the memory cells 102. The circuit 104 may be used to address individual memory cells 102 and to provide electrical energies used to change the state of the material and to read the data in the cell. A technique is provided for preprogramming cells in the array using an external energy source, such as an optical element, e.g., a scanning laser.

A non-volatile memory device may utilize the electrical properties of phase change materials to store data. For example, the memory device 100 shown in FIG. 1 may utilize a chalcogenide alloy, similar to that used in many CD-RW and DVD-RAM optical disks, as a phase change material. The circuit 104 may provide electrical energy to convert a small volume of the phase change material in one or more selected memory cells to a crystalline or to an amorphous state, which may be read as a "0" or "1" value, respectively. The phase conversion may be accomplished by heating the material. However, unlike in the rewritable optical disks described above (CD-RW and DVD-RAM), the circuit 104 provides the energy used to heat the material instead of a laser beam.

Heating the material in the crystalline phase above its melting point causes the material to lose its crystalline structure. When the material then cools below the glass transition temperature, the material is locked in its amorphous phase. The amorphous phase may be stable at room temperature, but the rate of nucleation and growth of crystallites may increase rapidly as the temperature of the material is raised toward the melting temperature. To switch the memory element back to the crystalline phase, the circuit 104 heats the material between the glass transition temperature and the melting temperature, causing rapid nucleation and crystal growth.

A memory cell may be read by applying an electric field to the cell. The material has a lower resistance in the crystalline state, and a small current will pass. The material has a relatively higher resistance in the amorphous state, and the applied voltage and the resistance of the material will limit the current through the cell.

It may be desirable to preprogram the memory device during the manufacturing process, before it is packaged and installed in a larger device. When the array is preprogrammed by electrical means, i.e., a transistor array, the current used to write to the memory cells may be limited by the constraints of the structure. This may increase programming time.

Figure 2:
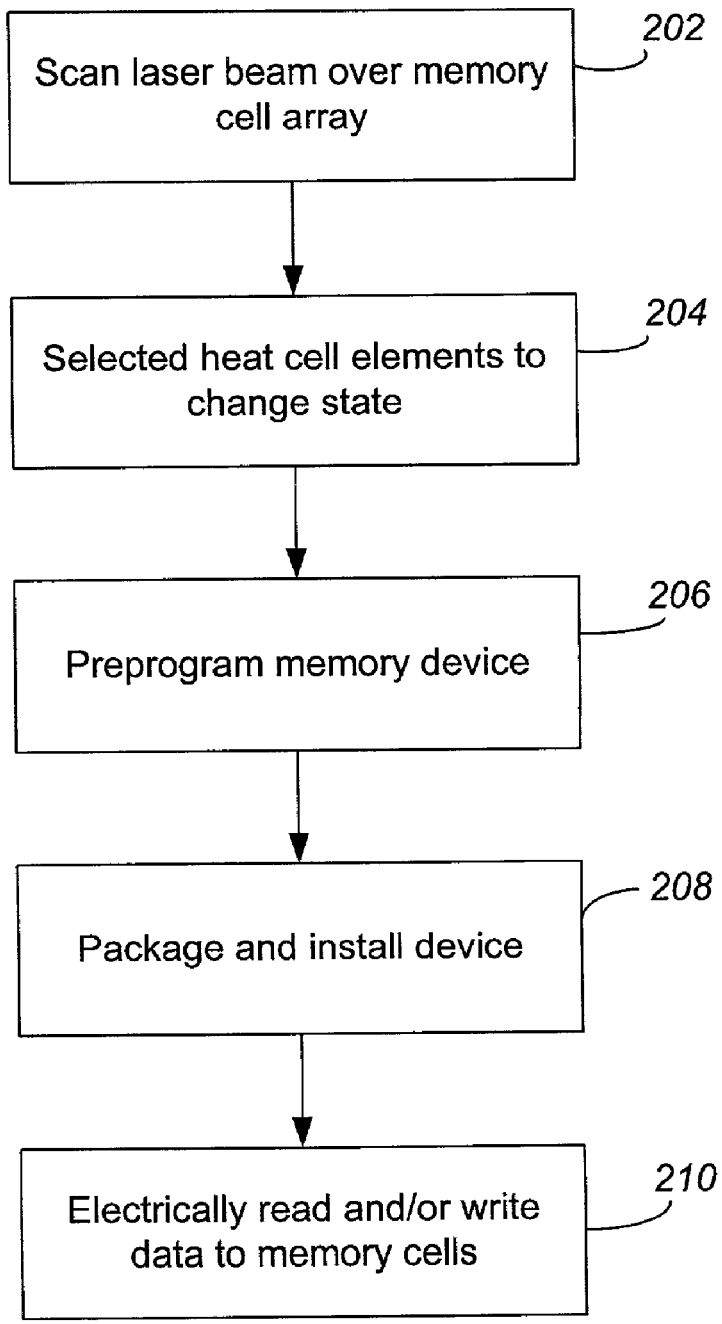
FIG. 2 is a flowchart describing a preprogramming method according to an embodiment.

FIG. 2 is a flowchart describing a preprogramming method 200 using an external energy source. The external energy source, in this example, a scanning laser beam, may provide more energy than the electrical programming method, and hence, may enable faster programming.

Figure 3:
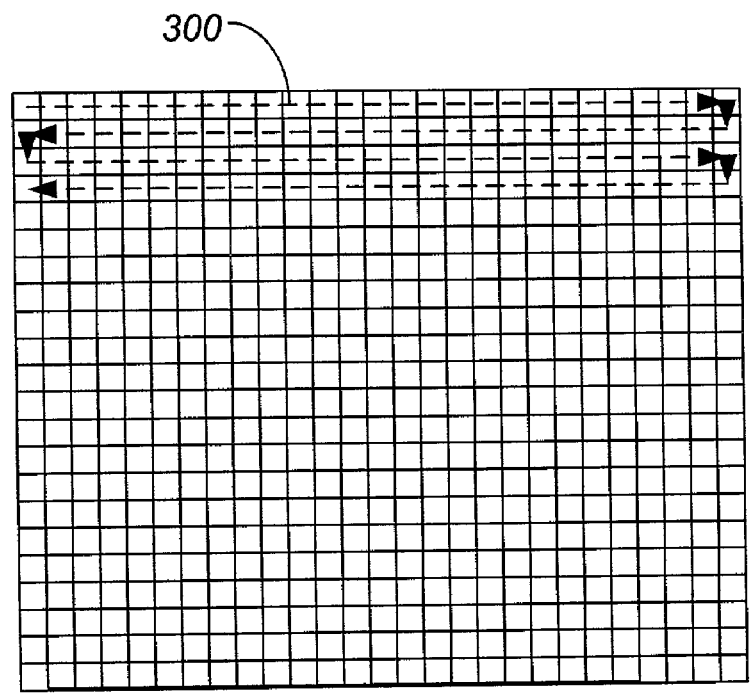
FIG. 3 is a plan view of a memory device and illustrates a scanning pattern for preprogramming the memory device according to an embodiment.

A scanning laser controller 106 may scan a laser beam 108 over individual memory cells 102 in the array. An exemplary scanning pattern 300 is shown in FIG. 3. The laser scans one row of the array in the X direction and then moves slightly in the Y direction before scanning access another row in the focal plan in the X direction.

The material in the memory cells 102 may originally be in the crystalline phase. Depending on the bit sequence loaded into the scanning laser controller for preprogramming, the laser may selectively heat memory cells corresponding to a "0" value above the melting point, causing a transition to the amorphous and less resistive state (block 204). The laser may scan the entire array of a portion of the array to be preprogrammed (block 206). Once preprogrammed, the memory device may be packaged and installed in a larger system or device (block 208).

After the initial preprogramming by the external energy source, the memory device may be read and written, including further programming, electrically using the circuit 104 (block 210). Once packaged and installed, the memory array may be sealed, and may not be further accessible by the laser.

Depending on the size of the memory cells, a tightly focused laser beam may be required to produce a very small spot on the surface of the array for scanning the individual memory cells 102. The size of the spot may be controlled by selecting one or more optical lenses for focusing the laser beam. For example, high numerical aperture (NA) lenses and solid immersion lenses (SILs) may produce such highly focused laser beams. High NA lenses are used for high resolution optical lithography and both types are used in optical and magneto-optical (MO) disk drives for reading and writing data.

The preprogrammed data may include identification information identifying the memory device. The preprogrammed data may also include parameters that identify the device to the system in which it is installed. This information may indicate the memory device's type and capacity.

The memory device 100 may be operable in different devices. The preprogrammed data may include one or more selectable configurations the memory device 100 may operate in. A user may select the configuration appropriate for the system in which the memory device will be used.

Figure 4:
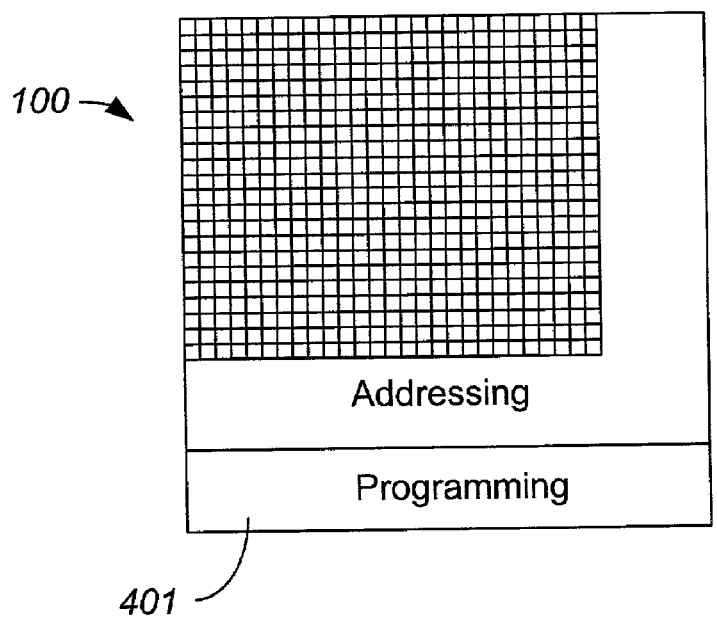
FIG. 4 is a block diagram of a memory device according to an embodiment.

The preprogrammed data may include instructions and/or data applicable to a particular application. This information may be re-writable, e.g., useful for set up on first use, or may be permanent, e.g., read only. The memory device 100 may include structure for programming the memory elements in the array, as shown in FIG. 4. In the case of permanent preprogrammed data, some of this programming structure 401 may be eliminated for the sector of memory that is read only, while remaining electrically addressable by the circuit 104 for accessing the programmed instructions and/or data. This may reduce the overall area of the device.

A number of embodiments have been described. Nevertheless, it will be understood that various modifications may be made without departing from the spirit and scope of the invention. For example, blocks in the flowchart may be skipped or performed out of order and still produce desirable results. Accordingly, other embodiments are within the scope of the following claims.

The invention claimed is:

1. An electrically-programmable phase change memory device comprising:
    a plurality of memory cells, each cell including a phase change material having a first electrical characteristic in a first phase and second electrical characteristic in a second phase, a plurality of said memory cells having been transitioned from the first phase to the second phase by an optically focused energy beam; and coupled to said plurality of memory cells
    a circuit to read and write to at least a plurality of said memory cells electrically.

2. The electrically-programmable phase change memory device of claim 1, wherein the phase change material comprises a chalcogenide alloy.

3. The electrically-programmable phase change memory device of claim 1, wherein the energy beam comprises a laser beam.

4. The electrically-programmable phase change memory device of claim 1, wherein the circuit comprises an addressing section and a programming section.

5. The electrically-programmable phase change memory device of claim 1, wherein the memory device comprises a non-volatile memory.

6. The electrically-programmable phase change memory device of claim 1, wherein the first and second electrical characteristics comprise a first and second resistance.

7. The electrically-programmable phase change memory device of claim 1, wherein the memory device is optically preprogrammed.

* * * * *